(12) United States Patent
Lee et al.

(10) Patent No.: US 7,415,646 B1
(45) Date of Patent: Aug. 19, 2008

(54) PAGE_EXE ERASE ALGORITHM FOR FLASH MEMORY

(75) Inventors: Mimi Lee, Santa Clara, CA (US);
Darlene Hamilton, San Jose, CA (US);
Ken Cheong Cheah, Penang (MY)

(73) Assignee: Spansion LLC, Sunnyvale, CA (US)

( * ) Notice: Subject to any disclaimer, the term of this patent is extended or adjusted under 35 U.S.C. 154(b) by 660 days.

(21) Appl. No.: 10/946,812

(22) Filed: Sep. 22, 2004

(51) Int. Cl.
*G01R 31/28* (2006.01)

(52) U.S. Cl. .......... 714/733; 714/30; 714/718; 714/719; 714/721; 714/734; 714/745; 714/723; 714/799; 324/765; 365/185.22; 365/201; 365/185.01; 365/185.24; 365/185.3; 365/185.33

(58) Field of Classification Search .......... None
See application file for complete search history.

(56) References Cited

U.S. PATENT DOCUMENTS

| | | | |
|---|---|---|---|
| 6,512,702 B1 * | 1/2003 | Yamamura et al. | 365/185.33 |
| 6,618,293 B2 * | 9/2003 | Keays | 365/185.29 |
| 6,618,294 B2 * | 9/2003 | Keays | 365/185.33 |
| 6,651,202 B1 | 11/2003 | Phan | |
| 6,665,214 B1 * | 12/2003 | Cheah et al. | 365/185.22 |
| 6,687,862 B1 | 2/2004 | Martinez | |
| 6,981,188 B2 * | 12/2005 | Galzur et al. | 714/719 |
| 7,117,402 B2 * | 10/2006 | Di Zenzo et al. | 714/716 |
| 7,161,835 B2 * | 1/2007 | Shiga | 365/185.22 |
| 2002/0031026 A1 * | 3/2002 | Kobayashi | 365/201 |
| 2002/0126539 A1 * | 9/2002 | Roohparvar | 365/185.33 |
| 2002/0154547 A1 * | 10/2002 | Hirano | 365/185.33 |
| 2003/0002347 A1 * | 1/2003 | Seki et al. | 365/185.29 |
| 2003/0067805 A1 * | 4/2003 | Roohparvar | 365/185.22 |
| 2003/0076125 A1 | 4/2003 | McCord | |
| 2005/0219909 A1 * | 10/2005 | Futatsuyama et al. | 365/185.22 |

* cited by examiner

*Primary Examiner*—John P Trimmings
(74) *Attorney, Agent, or Firm*—Eschweiler & Associates, LLC (57) ABSTRACT

Methods of performing a sector erase of flash memory devices incorporating built-in self test circuitry are provided. The present invention employs an interactive verification and sector erase algorithm to verify and repeatedly erase the sector until a portion of the groups of each page of the sector are erased or a first maximum number of erase pulses is achieved. The algorithm further includes a word verification and erase operation that sequentially verifies and erases each word of the sector until each word is erased or a second maximum number of erase pulses is achieved. The second maximum number of erase pulses may be based on a function of the first maximum number of erase pulses. The second maximum number of erase pulses may be input to the sector erase algorithm as a multi-bit code. The second maximum number of erase pulses and conversion of the multi-bit code may be based on a binary multiple of the first maximum number of erase pulses.

40 Claims, 7 Drawing Sheets

PRIOR ART

| EOE Code | % EXE Pulses | EOE Pulses | | | |
|---|---|---|---|---|---|
| 0001 | 6.25% | | | | EXE/16 |
| 0010 | 12.50% | | | EXE/8 + | |
| 0011 | 18.75% | | | EXE/8 + | EXE/16 |
| 0100 | 25.00% | | EXE/4 + | | |
| 0101 | 31.25% | | EXE/4 + | | EXE/16 |
| 0110 | 37.50% | | EXE/4 + | EXE/8 + | |
| 0111 | 43.75% | | EXE/4 + | EXE/8 + | EXE/16 |
| 1000 | 50.00% | EXE/2 + | | | |
| 1001 | 56.25% | EXE/2 + | | | EXE/16 |
| 1010 | 62.50% | EXE/2 + | | EXE/8 + | |
| 1011 | 68.75% | EXE/2 + | | EXE/8 + | EXE/16 |
| 1100 | 75.00% | EXE/2 + | EXE/4 + | | |
| 1101 | 81.25% | EXE/2 + | EXE/4 + | | EXE/16 |
| 1110 | 87.25% | EXE/2 + | EXE/4 + | EXE/8 + | |
| 1111 | 93.75% | EXE/2 + | EXE/4 + | EXE/8 + | EXE/16 |

Bit 3 ⤴  ⤴ Bit 0

Fig. 9

```
EXE       =   19
EOE Code  =  0111
EOE       =            EXE/4 +   EXE/8 +   EXE/16
          =            19/4 +    19/8 +    19/16
          =            4.75 +    2.375 +   1.1875   = 8.3125
          =            4 +       2 +       1        = 7 Pulses
```

Fig. 10

PAGE_EXE ERASE ALGORITHM FOR FLASH MEMORY

FIELD OF INVENTION

The present invention relates generally to memory devices and the like, and in particular to a method of erasing sectors of flash memory products implemented as built-in self test circuits.

BACKGROUND OF THE INVENTION

Improvements in semiconductor processes are making possible integrated circuits of increasing size and complexity. The semiconductor processing technologies that produce these integrated circuits have advanced to the point where complete systems, including memories, can now be reduced to a single integrated circuit or application specific integrated circuit (ASIC) device. These integrated circuits (also referred to as "die" or "chips") may use many functions that previously could not be implemented on a single die. It is a common practice for the manufacturers of such integrated circuits to thoroughly test device functionality at the manufacturing site. However, due to the complex nature of today's integrated circuits and an attendant sensitivity to variations in manufacturing processes, manufacturers are constantly confronted with new testing challenges.

Before manufacturers release integrated circuits for shipment, the devices typically undergo a variety of testing procedures. In ASIC devices incorporating integrated memories, for example, specific tests are performed to verify that each of the memory cells within the integrated memory array(s) is functioning properly. This testing is necessary because perfect yields are difficult to achieve. It is not uncommon for a certain percentage of unpackaged ASIC die to contain memory cells which fail testing processes, due largely to non-systemic manufacturing defects. Such manufacturing issues are likely to increase as process geometries continue to shrink and the density of memory cells increases. Even today, up to 1 Gbits or more of dynamic random access memory (DRAM), static random access memory (SRAM) or flash memory can be integrated onto a single integrated circuit.

A number of ASIC memory testing strategies have evolved, many of which involve use of an external memory tester or Automated Test Equipment (ATE). If memory is accessible from input/output (I/O) pins, a hardware test mode can be utilized. In this mode, a production test system accesses the memory directly by writing to and reading from the memory bits. The main disadvantage of using such standard test modes is that the test system must test the devices interactively. Consequently, only a limited number of devices can be tested at a given time, and a significant amount of overhead time is incurred due to tester limitations (e.g., power up time is needed on certain pins while the mode is being accessed and while the tester is controlling the chip and checking the results).

If an embedded memory is embedded within an ASIC, built-in self-test (BIST) is often considered the most practical and efficient test methodology and is becoming increasingly popular with semiconductor vendors. BIST allows timely testing of the memory with a reasonably high degree of fault coverage, without requiring continual interactive control via external test equipment.

BIST refers in general to any test technique in which the testing algorithm or test vectors are generated internal to a discrete memory, an integrated circuit, or ASIC device. The testing algorithm used in BIST may be generally implemented in embedded circuitry of the device. Test vectors are sequences of signals that are applied to integrated circuitry to determine if the integrated circuitry is performing as designed. BIST can be used to test these memories located anywhere on the device.

In the BIST approach, a test pattern generator and test response analyzer are incorporated directly into the device to be tested. BIST operation is controlled by supplying an external clock and via use of a simple commencement protocol. BIST testing is typically distilled to the level of a "passed" or "failed" result. At the end of a typical structured BIST test, or "run", a simple pass/fail signal is asserted, indicating whether the device passed or failed the test. Intermediate pass/fail signals may also be provided, allowing individual memory locations or group of locations to be analyzed. Unlike external testing approaches, at-speed testing with BIST is readily achieved. BIST also alleviates the need for long and convoluted test vectors and may function as a surrogate for functional testing or scan testing. Since the BIST structures exist and remain active throughout the life of the device, BIST can be employed at the board or system level to yield reduced system testing costs, reduce device rejects during production, and to reduce field diagnosis costs.

Many different types and styles of memory exist to store data for computers and similar type systems, wherein BIST circuits may be implemented. For example, random access memory (RAM), dynamic random access memory (DRAM), static random access memory (SRAM), read only memory (ROM), programmable read only memory (PROM), electrically programmable read only memory (EPROM), electrically erasable programmable read only memory (EEPROM) and flash memory are all presently available to accommodate data storage. Each type of memory has its own particular advantages and disadvantages.

Flash memory, has become a popular type of memory because it combines the advantages of the high density and low cost of EPROM with the electrical erasability of EEPROM. Flash memory can be rewritten and can hold its contents without power, and thus is nonvolatile and is suitable for BIST circuitry and testing methods. Flash memory is used in many portable electronic products, such as cell phones, portable computers, voice recorders, etc. as well as in many larger electronic systems, such as cars, planes, industrial control systems, etc.

Individual memory cells are organized into individually addressable units or groups, which are accessed for read, program, or erase operations through address decoding circuitry. The individual memory cells are typically comprised of a semiconductor structure adapted for storing a bit of data and includes appropriate decoding and group selection circuitry, as well as circuitry to provide voltages to the cells being operated upon.

The erase, program, and read operations are commonly performed by application of appropriate voltages to certain terminals of the memory cell. In an erase or write operation the voltages are applied so as to cause a charge to be removed or stored in the memory cell. In a read operation, appropriate voltages are applied so as to cause a current to flow in the cell, wherein the amount of such current is indicative of the value of the data stored in the cell. The memory device includes appropriate circuitry to sense the resulting cell current in order to determine the data stored therein, which is then provided to data bus terminals of the device for access by other devices in a system in which the memory device is employed.

In a NOR configuration, the control gate is connected to a wordline associated with a row of memory cells to form sectors of such cells. In addition, the drain regions of the cells along a given column are connected together by a conductive bitline. Respective flash cells associated with a given bitline have stacked gate terminals coupled to a different wordline, while all the flash cells in the array generally have their source terminals coupled to a common source terminal. In operation, individual flash cells are addressed via the respective bitline and wordline using the peripheral decoder and control circuitry for programming (writing), reading or erasing functions.

Programming circuitry controls a bit of a cell by applying a signal to the wordline, which acts as a control gate, and changing bitline connections such that the bit is stored by the source and drain connections. Erasing is performed as a blanket operation wherein an array or sector of cells can be simultaneously erased. Generally, a gate voltage is applied to the control gates via the wordline(s) and a drain voltage is applied to the drains via the bitlines, while the sources may be configured to float.

In the blanket erasing of flash memory, cells within an array or sector are typically erased concurrently and can be accomplished by one or more applications of short erase pulses. After each erase pulse, an erase verification can be performed to determine if each cell in the array is now "erased" (blank), or yet remains "un-erased" or "under-erased", (i.e., whether the cell has a threshold voltage above a predetermined limit). If an under-erased cell is detected, an additional erase pulse can be applied to the entire array. With such an erase procedure, however, cells that are sufficiently erased initially will also be repeatedly erased, leading to some cells becoming "over-erased" before other cells are sufficiently erased. A memory cell having a threshold voltage erased below a predetermined limit is commonly referred to as being over-erased. An over-erased condition is undesirable for many reasons.

In addition, testing algorithms used in BIST often attempt to determine a representative group of memory cells associated with a representative erase threshold level, by selecting edge columns, edge rows, or diagonal groupings of memory cells representative of the entire sector or array. Each grouping selection has a unique advantage, attempting to provide the representative erase level or a corresponding representative number of erase pulses required. Regardless of the grouping selected, however, a truly representative erase threshold level for the sector or array of memory cells is elusive, as differences exist between memory arrays and/or the particular ASIC application wherein the array resides. Further, the aforementioned grouping choices may not be sufficiently representative of the desired erase threshold level, and also may be difficult to implement in BIST circuitry.

In view of the foregoing, a need exists for an improved method implemented in BIST of erasing a sector or array of memory cells.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

The present invention effectively screens out bits which erase abnormally by applying an innovative page-based sector erase algorithm implemented in BIST circuitry to screen out abnormally erasing memory cells, reduce device testing costs, and reject and mitigate over-erase conditions. The algorithm of the present invention provides an erase method that is interactively derived and uniformly distributed by page across the array in two phases. In a first, or EXE, phase, erase verifications and block erasures are interactively applied to the sector in the form of erase pulses until a portion (e.g., percentage) of the groups of each page of the sector is erased (blank), or until a predetermined maximum number of erase operations for the sector (MaxEXE) is attained. In accordance with an aspect of the invention, the maximum number of erase pulses MaxEXE, may be provided in hardware.

The algorithm of the present invention further provides a second, an EOE, phase of the erase method that interactively verifies and erases words of each sector until each word is blank, or until a portion (e.g., percentage) of the MaxEXE (defined as the EOE, or MaxEOE) is attained. Thus, an erase threshold level uniformly representative of the array is obtained by erasing at least a portion of each page of the array sector during the EXE phase]. The present invention is implemented in a BIST circuit associated with the memory (e.g., an ASIC device) to reduce testing time and costs.

In accordance with another aspect of the sector erase algorithm of the present invention, the method provides a user input multi-bit code (e.g., a 4-bit code) representing the EOE (a percentage of the MaxEXE) to mitigate device testing rejects by permitting the user to determine an acceptable erase threshold level. Another aspect of the invention provides a method of conversion from the user input multi-bit code (EOE code) into the percentage of the MaxEXE, wherein the bits of the multi-bit code correspond to a binary multiple of the MaxEXE.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

DETAILED DESCRIPTION OF THE INVENTION

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, to one skilled in the art that one or more aspects of the present invention may be practiced with a lesser degree of these specific details. In other instances, well-known structures and devices are shown in block diagram form in order to facilitate describing one or more aspects of the present invention.

A page EXE erase algorithm may be used to erase a specified sector or portion of an array of memory cells. The erase algorithm of the present invention is suitably implemented as a circuit that may be included as "built-in self test" BIST circuitry on an ASIC device, for example. The method of the present invention provides an alternative to the diagonal or edge column based EXE erase method, sometimes employed in conventional wafersort testing, which is more difficult to implement in a circuit. Typically, these testing methods are accomplished using automated test equipment (ATE).

ATE equipment often contains complex circuitry including a number of registers along with the various application test algorithms to support the various ASIC devices to be tested. Initially, this arrangement was beneficial to perform testing functions in a central piece of testing equipment, thereby avoiding hardware and real estate duplication. However, partially because of the added wiring lengths and signal delays involved, ATE testing may add significant testing times, parasitic signal instabilities and testing uncertainties in contrast to BIST solutions. Fortunately, as ASIC device densities and scaling have improved, chip real estate costs have correspondingly plummeted. For these and other reasons, BIST circuit solutions have increasingly become the norm while significantly adding value to these devices.

Erasing of flash memory is typically a blanket operation in which cells within an array are erased concurrently. Erasing of the memory cells is often accomplished by repeated applications of short erase pulses. After each erase pulse, an erase verification can be performed to determine if each cell in the array is erased (blank), or is not erased (under-erased). If an under-erased cell is detected, an additional erase pulse is applied to the entire sector or array. As previously discussed, however, with such an erase procedure, erased cells will be repeatedly erased together with those that are under-erased, leading to some cells becoming "over-erased" before other cells are sufficiently erased and other such non-uniform cell erasure problems.

Cells that erase abnormally may have a marginally higher erase threshold, or may be candidates for device rejection if enough such cells exist, depending, in accordance with the present invention, on a number of erase pulses corresponding to an acceptable level defined by the user from, for example, a user multi-bit input.

Figure 1:
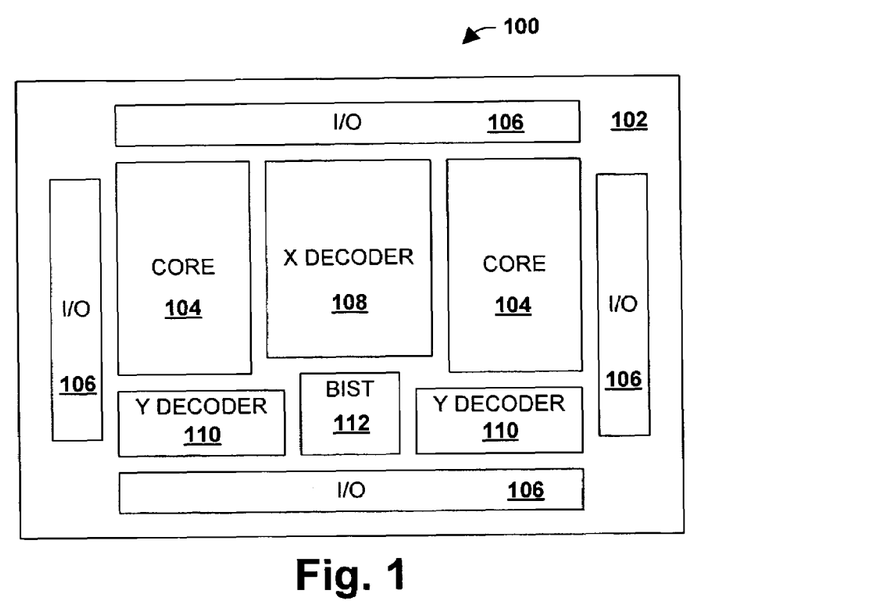
FIG. 1 is a top view of a flash memory device having BIST circuitry in accordance with an aspect of the present invention.

Referring initially to FIG. 1, a top view of an exemplary flash memory 100 having BIST circuitry in accordance with an aspect of the present invention is illustrated. The memory 100 generally includes a semiconductor substrate 102 in which one or more high-density core regions 104 and one or more peripheral portions are formed. The core regions 104 typically include one or more M by N arrays 104 of individually addressable, substantially identical flash memory cells. The peripheral portions on the other hand typically include input/output (I/O) circuitry 106 and programming circuitry for selectively addressing the individual memory cells. The programming circuitry is represented in part by, and includes, one or more x-decoders 108 and one or more y-decoders 110 that cooperate with the I/O circuitry 106 for selectively connecting an element of selected addressed memory cells to predetermined voltages or impedances to effect designated operations on the respective memory cells (e.g., programming, reading, erasing, and deriving necessary voltages to effect such operations).

The present invention further incorporates a built-in self test circuit BIST 112 that, for example, may be used to test the individual memory cells, words, groups, pages, sectors or other such portions or groupings of cells of the array 104 including other regions of the memory 100. In addition, the method of the present invention is suitable for memories and other semiconductor devices comprising memories including ASIC devices.

Conventionally, when such memories are erased as a portion of the testing in ATE equipment or as directed by BIST circuitry, array groupings are selected which are somewhat representative of the array as a whole. These representative memory cells are often used as a basis for establishing the level of erase threshold voltages or the number of erase pulses which need be applied to an array portion to achieve the required erase threshold. As discussed, these representative groupings selected may be edge rows, columns, or diagonal groupings further illustrated in FIGS. 2 and 3 to follow.

Figure 2:
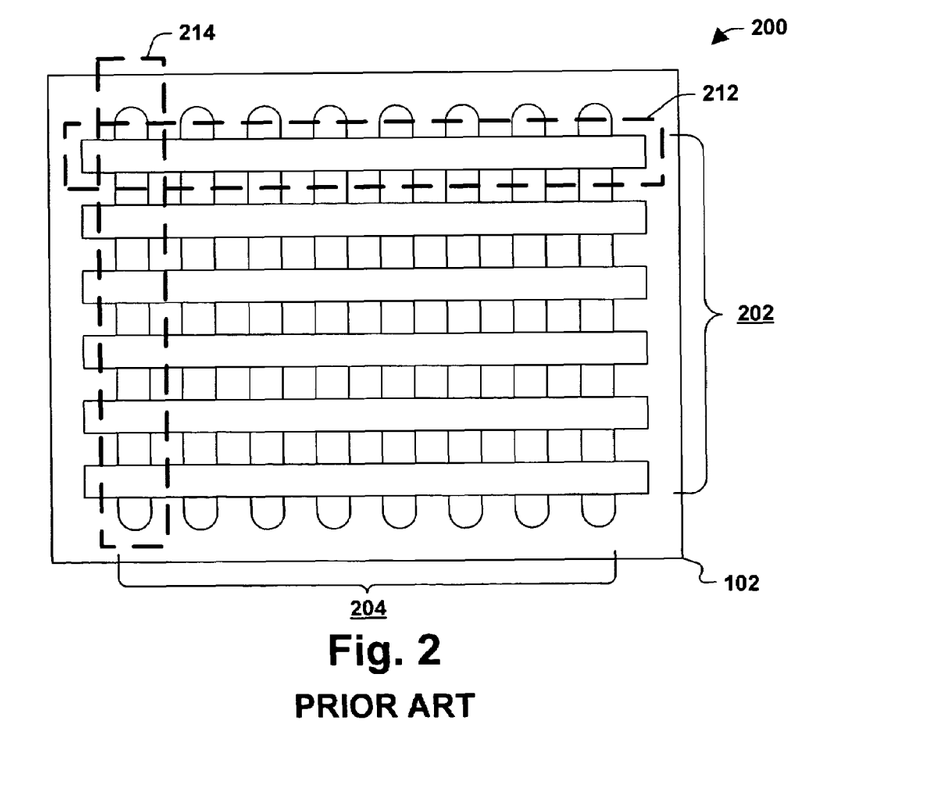
FIG. 2 is a top view of at least a portion of a memory core, such as may include representative edge column and edge row groupings of memory cells of at least part of one of the cores depicted in FIG. 1.

Referring now to FIG. 2, a top view is presented of at least a portion 200 of a memory core, such as may include representative edge column and edge row groupings of memory cells of at least part of one of the cores depicted in FIG. 1 in accordance with an aspect of the present invention. The memory 200 is an exemplary virtual ground arrangement, for example, and is formed upon a semiconductor substrate 102 and has, for example, a plurality of formed memory cell rows 202 corresponding to wordlines, and a plurality of formed memory cell columns 204 corresponding to memory cell bitlines 204. It will be appreciated that the wordlines 202 and bitlines 204 have contacts and interconnections (not shown) to programming circuitry such as may be represented, at least in part, by the x-decoders 108 and y-decoders 110 depicted in FIG. 1. A representative edge row 212 and a representative edge column 214 depict the representative groupings of memory cells that may be selected to represent the entire sector or array.

Figure 3:
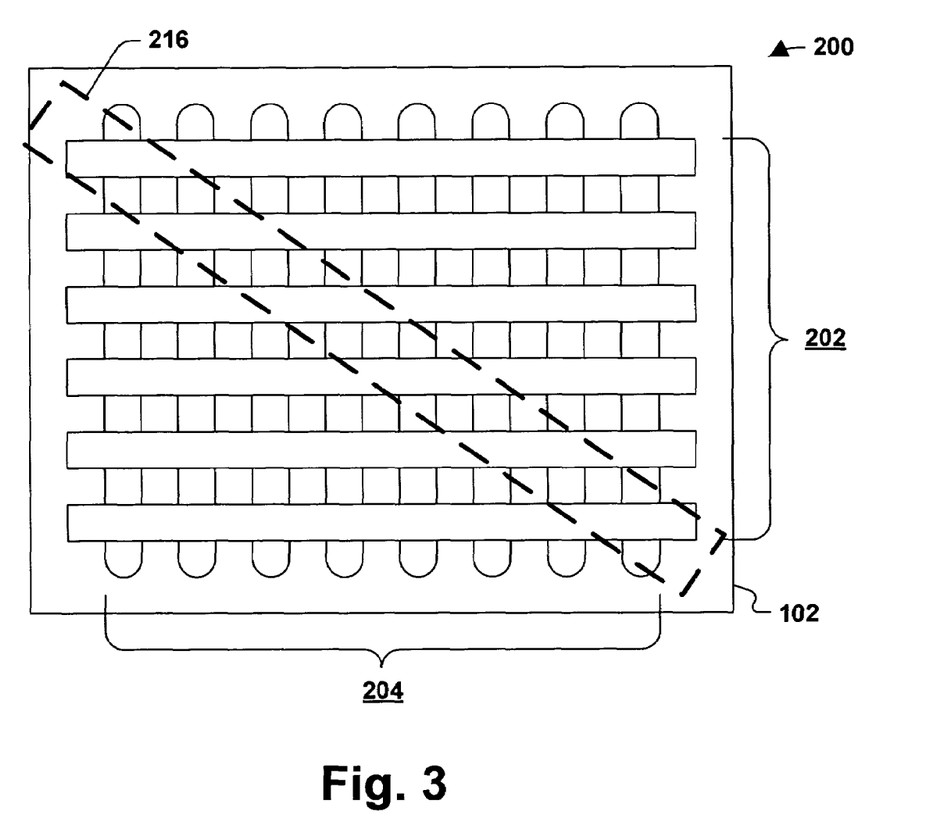
FIG. 3 is a top view of at least a portion of a memory core, such as may include a representative diagonal groupings of memory cells of at least part of one of the cores depicted in FIG. 1.

FIG. 3 also illustrates a top view of at least a portion 200 of the memory core, such as may include a representative diagonal grouping 216 of the memory cells of at least part of one of the cores depicted in FIG. 1 in accordance with an aspect of the present invention. Compared to the method of the present invention, the conventional edge row 212, edge column 214 and diagonal grouping 216 of memory cells may fall short in representing the erase threshold level for the sector or array of memory cells, because of the differences which exist between memory arrays and/or the particular ASIC application wherein the array resides. These grouping choices indicated also may not be sufficiently representative of the desired erase threshold level, and may also be difficult to implement in BIST circuitry.

Figure 4:
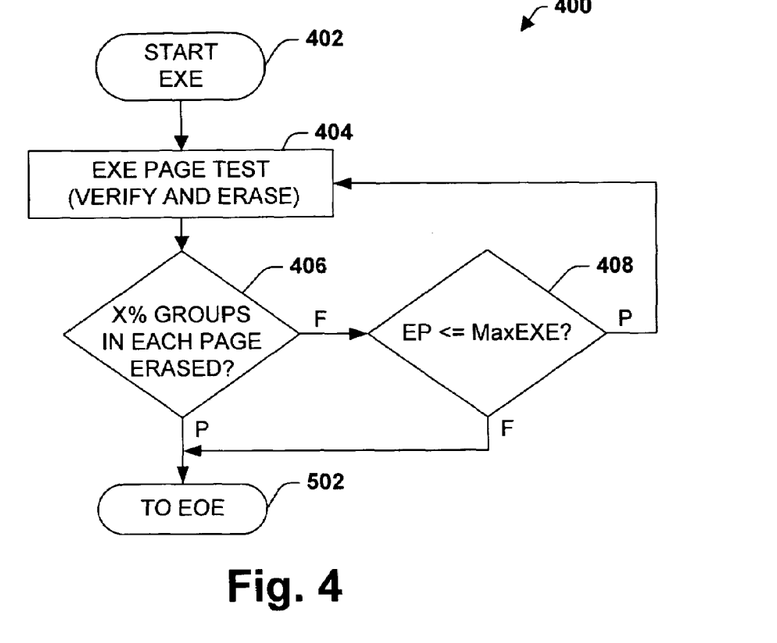
FIG. 4 is flow diagram illustrating an EXE phase of a method of erasing a sector or array of memory cells that includes interactively testing and erasing pages of memory cells in accordance with an aspect of the present invention.
Figure 5:
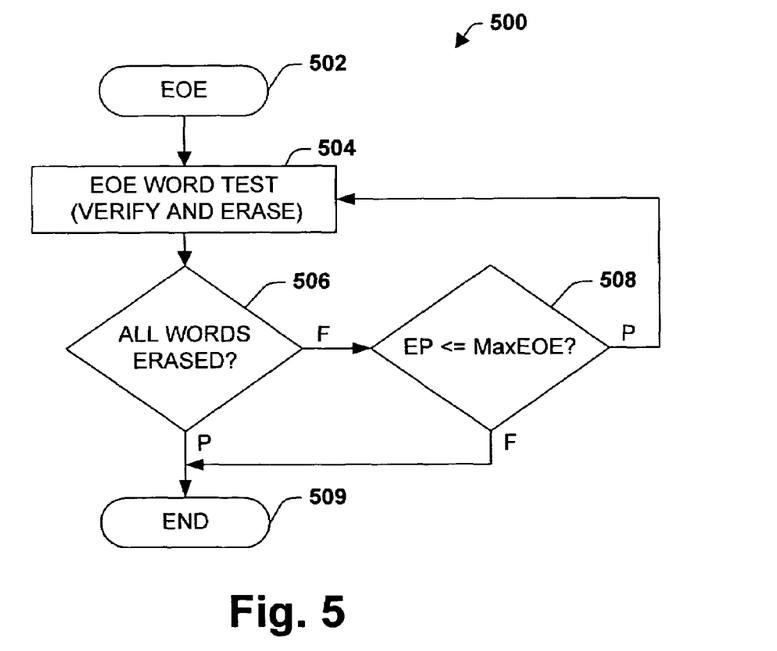
FIG. 5 is flow diagram further illustrating an EOE phase of the method of FIG. 4, of erasing a sector or array of memory cells that includes interactively testing and erasing words of memory cells in accordance with an aspect of the present invention.

A page-based sector erase algorithm implemented in BIST circuitry facilitates the method of the present invention. The method effectively screens out abnormally erasing memory cells, reduces device testing costs and rejects, and mitigates over-erase conditions. The erase algorithm and method of the invention is interactively applied and uniformly distributed across each page and word of the array in the two phases. FIGS. 4 and 5 illustrate exemplary flow diagrams of an EXE phase 400 and an EOE phase 500, respectively, of the method of the present invention. Although the methodology is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein. In addition, not all illustrated steps may be required to implement a methodology in accordance with one or more aspects of the present invention. Further, one or more of the acts may be carried out in one or more separate acts or phases.

FIG. 4 illustrates a flow diagram of the exemplary EXE phase 400 of the method of the present invention. EXE phase 400 of the method comprises erasing a sector or array of memory cells by iteratively testing and erasing pages of memory cells. In the EXE phase 400, erase verifications and block erasures of the sector are performed iteratively, for example, by applying erase pulses to the sector until a portion (e.g., percentage) of the groups of each page of the sector is erased (blank), or until a maximum number of erase operations for the sector (MaxEXE) is attained. MaxEXE may be derived based on empirical data, for example, of the typical number of erases pulses required to erase a desired percentage of the memory cells. The maximum number of erase pulses MaxEXE may be provided in hardware in accordance with an aspect of the invention.

For example, the EXE phase 400 of the method begins at 402 (e.g., using BIST circuitry), wherein the BIST circuitry initiates testing pages within the embedded, or associated sector of memory at 404. Groups within each page of the sector are verified at 406 to determine whether a predetermined portion or a percentage of the groups of memory cells of the page have been erased. If the desired percentage of groups have not been erased (F at 406), the EXE phase 400 continues at 408 to determine whether the current number of sector erase pulses EP has reached the maximum number of erase pulses MaxEXE allowed (e.g., as stored in hardware). Subsequently, if it is determined at 408 that EP is less than or equal to MaxEXE (P), additional sector erase pulses are applied to the sector at 404, otherwise if the MaxEXE is attained at 408 (F), or the percentage of groups have been erased as determined at 406 (P), the method continues to the EOE phase 500 at 502. In this way, each group and page of the sector or array is effectively erased and verified, insuring a uniform distribution of erasure to the extent allowed by the number of erase pulses represented by MaxEXE.

FIG. 5 illustrates a flow diagram of the exemplary EOE phase 500 of the method of the present invention. EOE phase 500 of the method comprises continuing to erase the sector or array of memory cells by interactively testing and erasing words of memory cells. In particular, the EOE phase 500 interactively verifies and erases words of each sector until each word is blank, or until a portion (e.g., percentage) of the MaxEXE (defined as the EOE, or MaxEOE) is attained.

For example, the EOE phase 500 of the method begins at 502 (e.g., using BIST circuitry), wherein the BIST circuitry initiates testing of words in the embedded, or associated sector of memory at 504. Each word, for example, having 8 or 16 bits per word within the sector, is verified at 506 to determine whether it has been erased. If the selected word has not been erased (F at 506), the EOE phase 500 continues at 508 to determine whether the current number of sector erase pulses EP has reached an allowed percentage Max EOE (e.g., set by a user defined input) of the maximum number of erase pulses MaxEXE. If it is determined that EP is less than or equal to MaxEOE, additional sector erase pulses are applied iteratively to the sector at 504. Thereafter, if the MaxEOE is attained (F at 508), or all the words have been erased at 506 (P), the EOE phase 500 of the method ends at 509.

Thus, each word of the sector or array is effectively erased and verified, insuring a uniform distribution of erasure to the extent allowed by the number of erase pulses MaxEXE, and for example, a user defined input percentage Max EOE. By implementing the present invention in a BIST circuit in close proxity to the memory, such as in an ASIC device, testing time and costs may be reduced.

Figure 6:
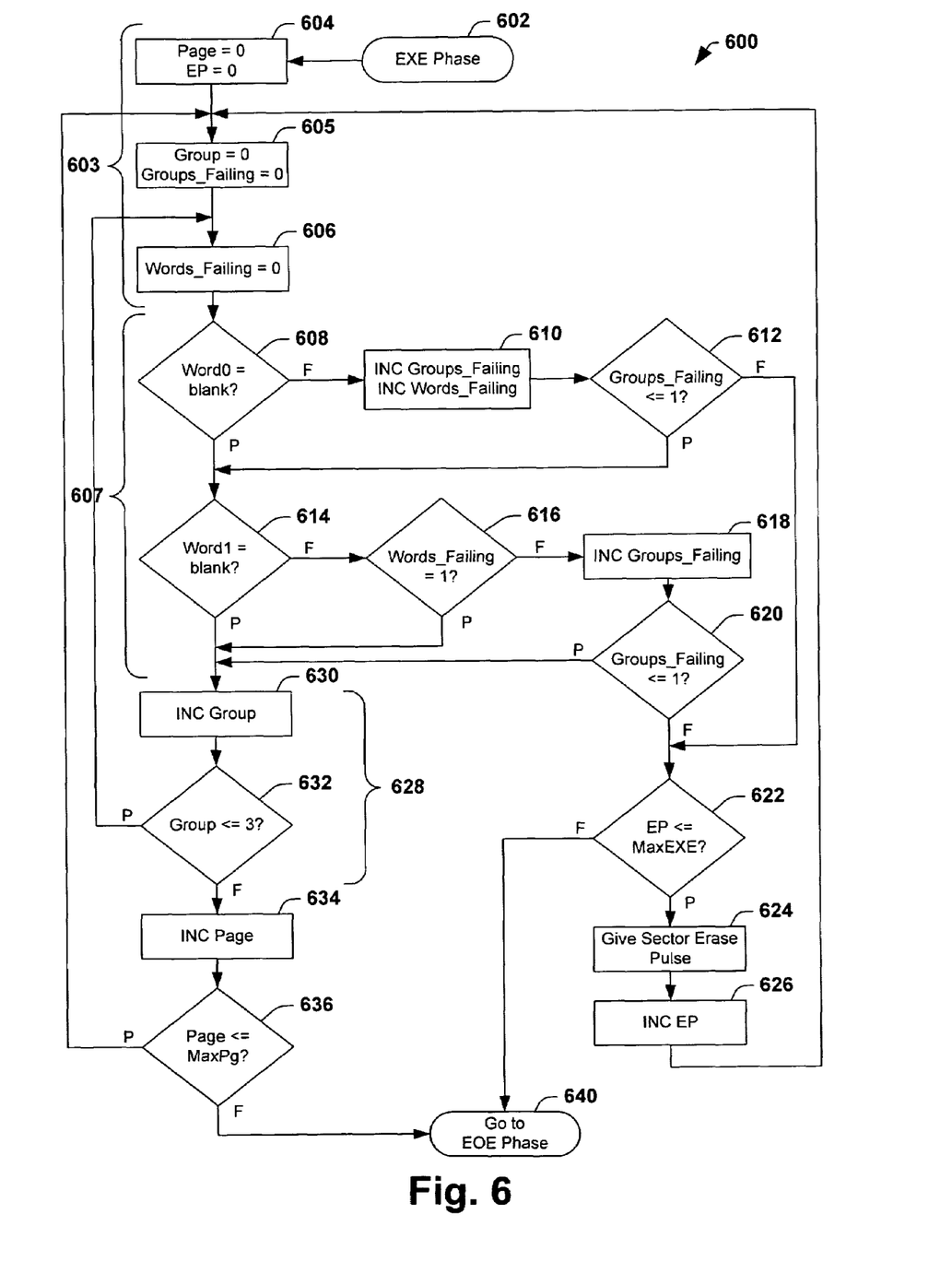
FIG. 6 is flow diagram illustrating details of an exemplary EXE phase of a method of erasing a sector or array of memory cells that includes interactively testing and erasing pages of memory cells in accordance with an aspect of the present invention.
Figure 7:
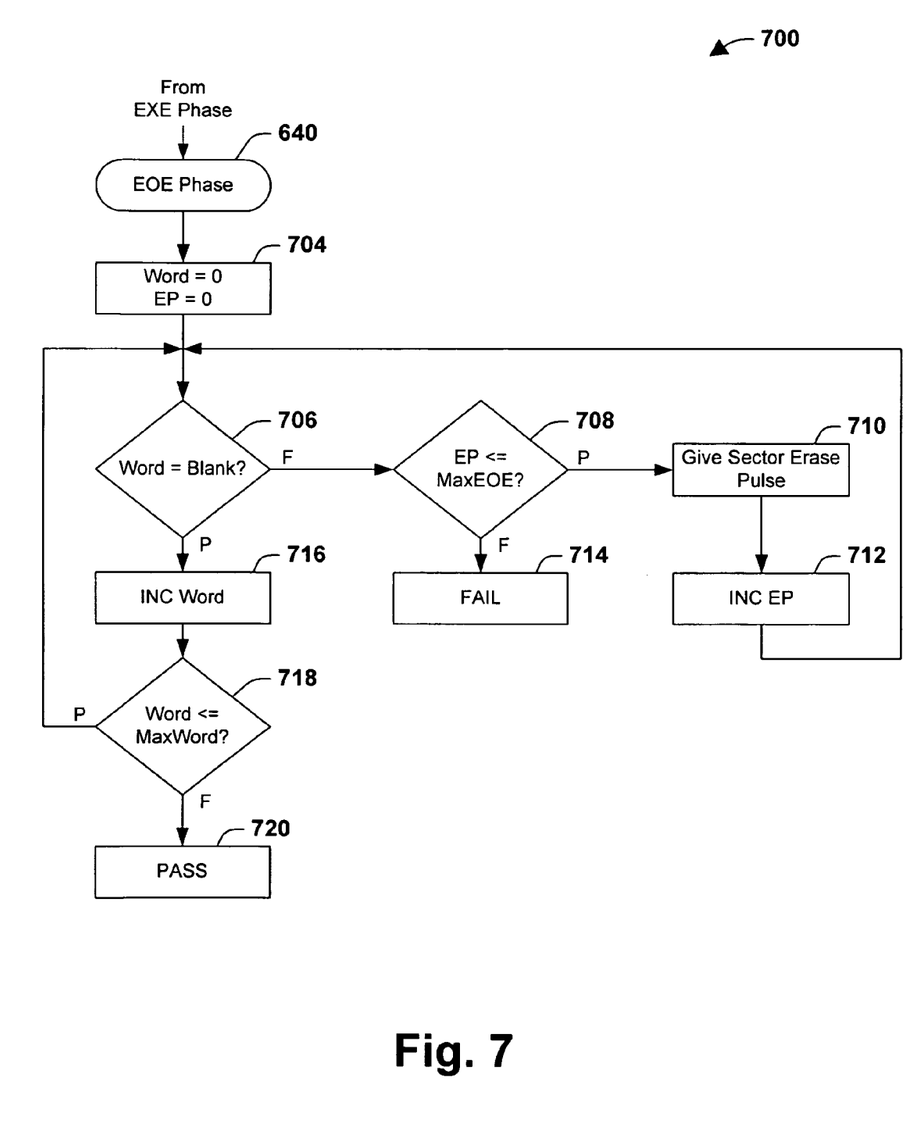
FIG. 7 is flow diagram further illustrating details of an exemplary EOE phase of the method of FIG. 6, of erasing a sector or array of memory cells that includes interactively testing and erasing words of memory cells in accordance with an aspect of the present invention.

FIGS. 6 and 7 illustrate further details of exemplary flow diagrams of an EXE phase 600 and an EOE phase 700, respectively, of the method of the present invention of erasing a sector or array of memory cells. FIGS. 6 and 7 are similar to those of FIGS. 4 and 5, respectively, and as such need not be fully described again for the sake of brevity.

FIG. 6 is flow diagram illustrating details of an exemplary EXE phase 600 of the sector erase method of the present invention. In the EXE phase 600, a page based sector erase is accomplished by iteratively performing erase verifications and block erasures of the sector, for example, by applying erase pulses to the sector until a portion (e.g., percentage) of the groups of each page of the sector is erased (blank), or until a maximum number of erase operations for the sector (MaxEXE) is attained.

For example, the EXE phase 600 of the method of the present invention begins at 602 followed by a set of counter initializations to zero at 603. The initializations comprise a page count and erase pulse (EP) initialization at 604, a group and group_failing count initialization at 605, and a words_failing count initialization at 606. In the present example, each page of the sector is divided into four groups of two words each. Thus, each page has eight words. A sector of an array may comprise, for example, 8 k pages, having 8 k×8 words=64 k words. At 607, a group verify is accomplished, wherein the two words (e.g., word0 and word1) of each group are verified to determine that the selected group is erased. The group verify of 607 comprises verifying that word0 is blank at 608, and if word0 is not blank (F at 608), incrementing the groups_failing and words_failing counts at 610, and testing whether the groups_failing count is less than or equal to one at 612. The group verify of 607 further comprises verifying that word1 is blank at 614, and if word1 is not blank (F at 614), testing whether the words_failing count is equal to one at 616, incrementing the groups_failing count at 618 if the words_failing count is not equal to one, and testing whether the groups_failing count is less than or equal to one at 620.

If it is determined at 612 or 620 that the groups_failing count is now incremented to a value greater than one, an erase pulse EP count check is performed at 622 to determine if EP (the number of applied sector erase pulses) is less than or equal to the maximum allowed pulse count MaxEXE (e.g., set in hardware). If EP is less than or equal to the maximum allowed pulse count MaxEXE at 622 (P), a sector erase pulse is applied to the sector at 624, EP is incremented at 626, and the EXE phase 600 continues to reinitialize the group and group_failing counts at 605 for testing another page of the sector.

The contributors of the present invention have chosen, in the present example to test at 628 to ensure that a portion or percentage of the groups (e.g., three of the four groups) in each page are erased. This page erase portion test 628 commences if it is determined that word1 is blank at 614, if words_failing is equal to one at 616, or if the groups_failing count is less than or equal to one at 620. The page erase portion test 628 includes incrementing the current group count at 630 and subsequently testing whether the group count is less than or equal to three at 632.

If the group count is less than or equal to three at 632 (P), further another group of two words is verified beginning at 606, otherwise if the group count is greater than three at 632 the page count is incremented at 634 and the page count is tested at 636 whether the last page of the sector has been tested. If it is determined at 636 that the last page has not been tested (P), another page based sector erase continues at 605 of the EXE phase 600 in accordance with the present invention. Otherwise, if it is determined at 636 that the last page of the sector has been tested (F at 636), or if it is determined at 622 that EP is greater than the maximum allowed pulse count MaxEXE, the EXE phase 600 of the page based sector erase ends at 640, and the sector erase method continues to the EOE phase 700.

FIG. 7 is a flow diagram further illustrating details of an exemplary EOE phase 700 of the method of FIG. 6, of erasing a sector or array of memory cells that includes iteratively testing and erasing all words of the sector or array in accordance with an aspect of the present invention.

For example, the EOE phase 700 (word test) of the sector erase method of the present invention continues from the EXE phase 600 beginning at 640 followed by a word count and erase pulse (EP) initialization at 704. Subsequently, at 706 the EOE phase 700 includes testing a word of the sector to determine if the word is erased (blank). If the word is not erased at 706 (F), the erase pulse count EP is tested at 708 to determine if EP is less than or equal to the maximum number of allowable erase pulses MaxEOE for the EOE phase 700. In accordance with another aspect of the sector erase algorithm of the present invention, MaxEOE may be determined by a user input, such as a user input multi-bit code (e.g., a 4-bit code) representing the EOE as a percentage of the MaxEXE.

The MaxEOE count or percentage is provided to mitigate device testing rejects by permitting the user to, in effect, define an acceptable erase threshold level for the memory cells of the array. The user accomplishes this by quantitatively defining the EOE in terms of a percentage of the maximum allowable erase pulses of the sector MaxEXE.

If it is determined at 708 that EP is less than or equal to MaxEOE (P), a sector erase pulse is applied to the sector at 710, EP is incremented at 712, and the EOE phase 700 continues to 706 for erase verification of another word of the sector. If, however the word is not blank at 706 and EP is determined at 708 to be greater than MaxEOE (F at 708), the word or the entire device may be identified as a failure at 714 to end the EOE phase 700 of the sector erase method.

Otherwise, if a determination is made that the word is blank at 706, the word count is incremented at 716 and the word count is tested at 718 to determine if the last word (MaxWord) of the sector has been verified. If it is determined that the last word has not been tested at 718 (P), another word test continues at 706 of the EOE phase 700 in accordance with the present invention. Otherwise, if it is determined at 718 that the last word of the sector has been tested (F), the words of the sector pass the word test at 720, and the EOE phase 700 of the sector erase method ends.

Another aspect of the invention provides a method of conversion from the user input multi-bit code (EOE code) into the percentage of the MaxEXE, wherein the bits of the multi-bit code (e.g., a 4-bit code) correspond to a binary multiple of the MaxEXE.

Figure 8:
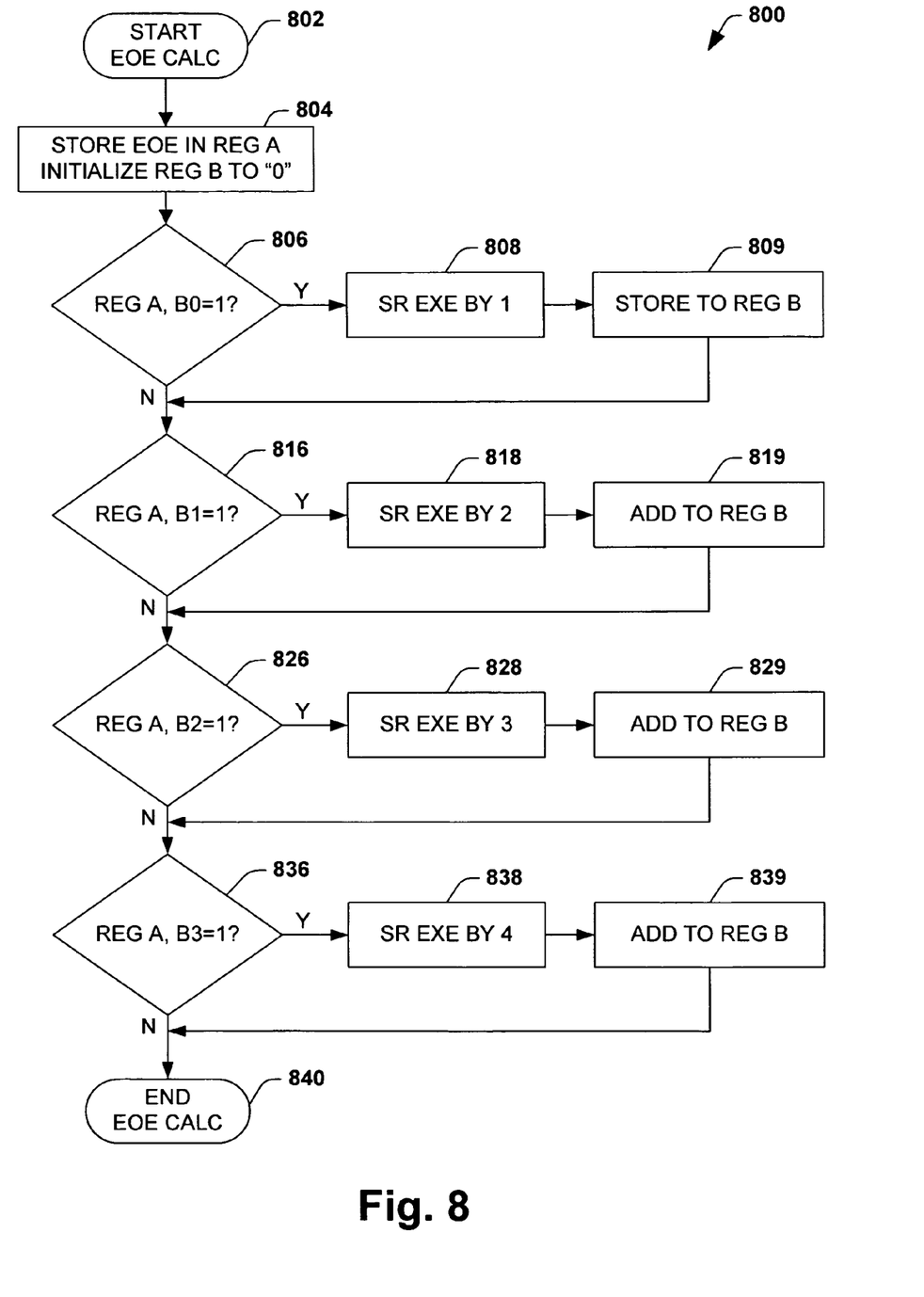
FIG. 8 is a flow diagram illustrating an exemplary method for converting a multi-bit EOE code to a binary multiple of the MaxEXE used in the EOE phase in accordance with an aspect of the present invention.

FIG. 8, for example, illustrates a flow diagram of an exemplary method 800 for converting a multi-bit EOE code to a binary multiple of the MaxEXE used in the EOE phase in accordance with an aspect of the present invention. Conversion method 800 utilizes an exemplary 4-bit code that may be input by the user for use in the EOE phase of the sector erase algorithms discussed herein. The exemplary conversion method 800 begins at 802, wherein a user input EOE 4-bit code is stored in a memory register (Reg A), and Reg B is also initialized to 0 at 804. Bit 0 (B0) of Reg A is tested at 806 to determine if Bit 0 of Reg A is equal to one. If Bit 0 is one (Y at 806), the binary value representing EXE is shifted right (SR) by one bit at 808 and the result is stored to a Reg B at 809. Thereafter, the state of Bit 1 (B1) of Reg A is tested at 816 together with a determination that Bit 0 is not equal to one (N at 806).

If Bit 1 is one (Y at 816), the binary value representing EXE is shifted right by two bits at 818 and the result is added to Reg B at 819. Thereafter, the state of Bit 2 (B2) of Reg A is tested at 826 together with a determination that Bit 1 is not equal to one (N at 816).

If Bit 2 of Reg A is one at 826 (Y), the binary value representing EXE is shifted right by three bits at 828 and the result is added to Reg B at 829. Thereafter, the state of Bit 3 (B3) of Reg A is tested at 836 together with a determination that Bit 2 is not equal to one (N at 826).

Finally, if Bit 3 is one at 836 (Y), the binary value representing EXE is shifted right by four bits at 838 and the result is added to Reg B at 839. Thereafter, the conversion method 800 ends at 840 together with a determination that Bit 3 is not equal to one (N at 836). The result of the conversion is now present in memory register Reg B containing the number of EOE pulses that may be used in the EOE phase. It should be noted that this calculated value of EOE may be less than the "true" EOE, as the numbers are rounded down to the nearest whole number as a result of the exemplary conversion method described above. It is appreciated that other suitable conversion methods or hardware may be employed whereby a user input code is converted to an EOE code or another such value representing a number of erase pulses as a portion or percentage of the MaxEXE.

Figure 9:
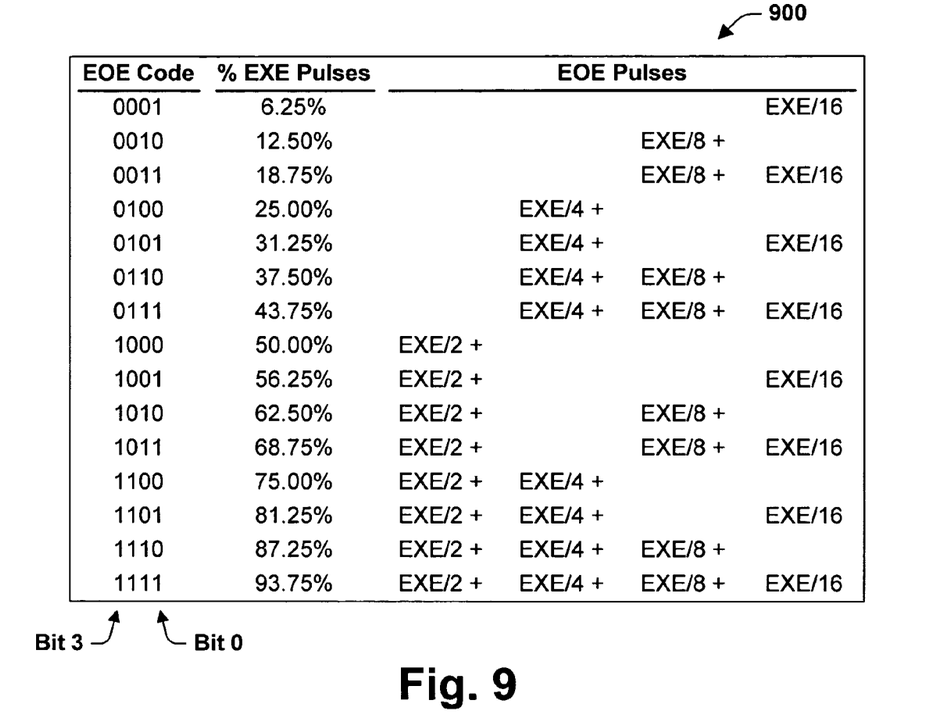
FIG. 9 is a table illustrating an exemplary conversion between a multi-bit EOE code, the percentage of EXE pulses resulting therefrom, and the binary multiples of the MaxEXE used in the EOE phase in accordance with an aspect of the present invention.

FIG. 9 illustrates a table 900 of the exemplary conversion between a multi-bit EOE code (e.g., a 4-bit code), the percentage of EXE pulses resulting therefrom, and the binary multiples of the MaxEXE used in the EOE phase in accordance with an aspect of the present invention and the conversion method 800 of FIG. 8. FIG. 9 also illustrates Bit 0 and Bit 3 of the EOE code for reference sake.

Bit 0 represents a multiple of EXE wherein EXE is divided by 16,

Bit 1 represents a multiple of EXE wherein EXE is divided by 8,

Bit 2 represents a multiple of EXE wherein EXE is divided by 4, and

Bit 3 represents a multiple of EXE wherein EXE is divided by 2.

Figure 10:
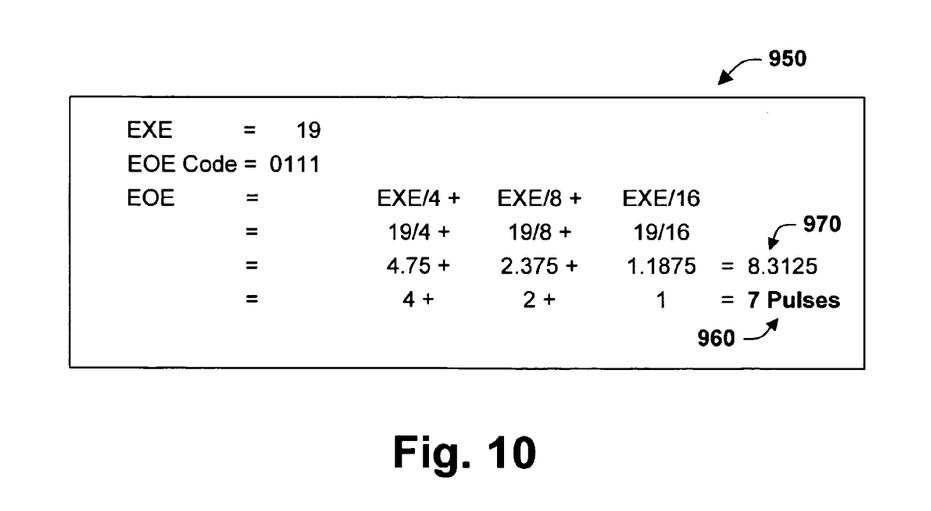
FIG. 10 is an exemplary multi-bit EOE code conversion illustrating a sample EXE maximum pulse count of 19, a sample EOE code input of 0111, the binary multiples of the MaxEXE, and the number of pulses resulting therefrom, using the calculation method illustrated in the table of FIG. 9.

These calculations, as indicated in FIGS. 8-10, may be accomplished by shifting right (SR) the EXE value. In the exemplary conversion method the EOE step size will be 1/16=6.25%, and will range from 6.25% to 93.75% of the number of EXE pulses. The EOE (% of EXE pulses) may be input, for example, via the command interface as a 4-bit EOE code. FIG. 8 and Table 900 of FIG. 9 illustrates that the number of EOE pulses is calculated by adding a specified binary fraction of the EXE together as selected by the user, for example, by inputting a word to the BIST tester.

FIG. 10 illustrates an exemplary multi-bit EOE code conversion 950 using the calculation method illustrated in the table of FIG. 9. The sample code conversion 950 illustrates a sample EXE maximum pulse count of 19 together with a sample user supplied input EOE code of 0111. The sample EXE and EOE presented further results in the binary multiples of the MaxEXE, and the number of pulses shown.

Note, as indicated above, that the calculated value of EOE 960, is less than the "true" EOE 970, as the numbers are rounded down to the nearest whole number using the exemplary conversion method described above. It should also be noted that the impact of the "round-off error" shown, is inversely proportional to the number of EXE pulses. Thus, there is less impact if EXE pulse count is higher.

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A method of erasing a sector of memory cells having a built-in self test circuit, the method comprising:
performing a block erase operation on the sector of memory cells by the built-in self test circuit; and
verifying the block erase operation of the memory cells by identifying pages of erased memory cells of the sector and re-performing the block erase operation on the sector until a percentage comprising fewer than all groups of the memory cells in each page of the sector are erased or a first number of block erase operations is obtained.

2. The method of claim 1, further comprising verifying the block erase operation of the memory cells by identifying words of erased memory cells of the sector and re-performing the block erase operation on the sector until all words of the sector are erased or a second number of block erase operations is obtained.

3. The method of claim 2, wherein the second number of block erase operations comprises a maximum number of erase pulses allowed during an EOE phase of erase operations.

4. The method of claim 2, wherein verifying the block erase operation of the memory cells by identifying words of erased memory cells of the sector and re-performing the block erase operation on the sector until all words of the sector are erased or the second number of block erase operations is obtained comprises:
initializing a word count and an erase pulse count to zero;
selecting a word of the sector;
determining whether the selected word of the sector is blank;
determining whether the second number of block erase operations has been obtained if the word is not blank;
performing the block erase operation on the sector if the second number of block erase operations has not been obtained, and incrementing the erase pulse, otherwise failing the device if the second number has been obtained;
incrementing the word count if the word is blank;
determining whether the final word of the sector has been obtained;
repeating the sector erase verification operation if the final word of the sector has not been obtained; and
passing the sector erase verification operation if the final word of the sector has been obtained.

5. The method of claim 3, wherein the second number of block erase operations is determined by a multi-bit code.

6. The method of claim 5, wherein the multi-bit code is input by a user.

7. The method of claim 5, wherein the bits of the multi-bit code correspond to a binary multiple of the first number of block erase operations.

8. The method of claim 6, wherein the multi-bit code comprises a 4 bit code.

9. The method of claim 1, wherein the percentage of the groups in each page of the sector erased corresponds to three out of four groups of each page of memory cells of the sector.

10. The method of claim 1, wherein the first number of block erase operations comprises a maximum number of erase pulses allowed during the block erase operations.

11. The method of claim 1, wherein the first number of block erase operations comprises a maximum number of erase pulses allowed during an EXE phase of block erase operations.

12. The method of claim 11, wherein the maximum number of erase pulses allowed during the EXE phase of block erase operations is hardwired in the built-in self test circuit.

13. The method of claim 11, wherein a second number of block erase operations comprises a maximum number of erase pulses allowed as a percentage of the first number of block erase operations.

14. The method of claim 1, further comprising pre-programming the array of memory cells prior to performing the block erase operation.

15. The method of claim 1, wherein the block erase operation reduces threshold voltage values corresponding to bits of respective memory cells of the sector.

16. The method of claim 1, wherein verifying the block erase operation includes identifying erased memory cells by measuring threshold voltage values corresponding to bits of respective memory cells of the sector and comparing the measured values with a minimum erase threshold voltage value.

17. A method of erasing a sector of an array of memory cells utilizing a built-in self test circuit, the method comprising:
   initializing a page count, an erase pulse count, a group count, a groups_failing count, and a words_failing count to zero;
   determining whether a Word0 of the group and page is blank;
   incrementing the groups_failing count, and the words_failing count if Word0 is determined to be not blank;
   determining whether the groups_failing count is less than or equal to one after incrementing the groups_failing count and the words_failing count;
   determining whether a Word1 of the group and page is blank if the Word0 of the group and page is blank, or if the groups_failing count is less than or equal to one;
   determining whether the groups_failing count is equal to one if Word0 is blank;
   otherwise determining whether the words_failing count is equal to one if Word1 is not blank;
   incrementing groups_failing if the words_failing count is equal to one and Word1 is not blank;
   determining whether groups_failing is less than or equal to one, if the words_failing count is equal to one and Word1 is not blank;
   performing a block erase operation on the array of memory cells using the built-in self test circuit;
   verifying the block erase operation of the array of memory cells to determine whether words, groups, and pages of memory cells of the sector are erased; and
   re-performing the block erase operation on the sector until a percentage of the groups in each page of the sector are erased or a first number of block erase operations is obtained.

18. The method of claim 17, further comprising verifying the block erase operation of the memory cells by identifying words of erased memory cells of the sector and re-performing the block erase operation on the sector until all words of the sector are erased or a second number of block erase operations is obtained.

19. The method of claim 18, wherein the second number of block erase operations comprises a maximum number of erase pulses allowed during an EOE phase of block erase operations.

20. The method of claim 18, wherein verifying the block erase operation of the memory cells by identifying words of erased memory cells of the sector and re-performing the block erase operation on the sector until all words of the sector are erased or a second number of block erase operations is obtained comprises:
   initializing a word count and an erase pulse count to zero;
   selecting a word of the sector;
   determining whether the selected word of the sector is blank;
   determining whether the second number of block erase operations has been obtained if the word is not blank;
   performing a block erase operation on the sector if the second number of block erase operations has not been obtained, and incrementing the erase pulse, otherwise failing the device if the second number has been obtained;
   incrementing the word count if the word is blank;
   determining whether the final word of the sector has been obtained;
   repeating the sector erase verification operation if the final word of the sector has not been obtained; and
   passing the sector erase verification operation if the final word of the sector has been obtained.

21. The method of claim 19, wherein the second number of block erase operations is determined by a multi-bit code.

22. The method of claim 21, wherein the multi-bit code is input by a user.

23. The method of claim 21, wherein the bits of the multi-bit code correspond to a binary multiple of the first number of block erase operations.

24. The method of claim 22, wherein the multi-bit code comprises a 4 bit code.

25. The method of claim 17, wherein the percentage of the groups in each page of the sector erased corresponds to three out of four groups of each page of memory cells of the sector.

26. The method of claim 17, wherein the first number of block erase operations comprises a maximum number of erase pulses allowed during the block erase operations.

27. The method of claim 17, wherein the first number of block erase operations comprises a maximum number of erase pulses allowed during an EXE phase of block erase operations.

28. The method of claim 27, wherein the maximum number of erase pulses allowed during the EXE phase of block erase operations is hardwired in the built-in self test circuit.

29. The method of claim 27, wherein the second number of block erase operations comprises a maximum number of erase pulses allowed as a percentage of the first number of block erase operations.

30. The method of claim 27, wherein the second number of block erase operations comprises a maximum number of erase pulses allowed based on a function of the first number of block erase operations.

31. A method of erasing a sector of memory cells having a built-in self test circuit, the method comprising:
   verifying whether words, groups, and pages of memory cells of the sector are erased; and
   performing a block erase operation on the sector using the built-in self test circuit until a percentage comprising less than 100% of the groups in each page of the sector are erased or a first number of block erase operations is obtained.

32. The method of claim 31, further comprising verifying the block erase operation of the memory cells by identifying words of erased memory cells of the sector and re-performing the block erase operation on the sector until all words of the sector are erased or a second number of block erase operations is obtained.

33. The method of claim 32, wherein the verifying whether words, groups, and pages of memory cells of the sector are erased comprises:
   initializing page, group, and word counts for the sector;
   selecting a page, group, and word of the sector;
   determining whether the words of the selected group are erased;
   determining whether the groups of the selected page are erased; and
   determining whether the percentage of the groups in each page of the sector are erased.

34. The method of claim 32, wherein performing a block erase operation on the sector comprises:
   determining whether a first number of block erase operations is obtained; and
   performing a block erase operation on the sector if the first number of block erase operations has not been obtained.

35. The method of claim 32, wherein the verifying the block erase operation of the memory cells by identifying words of erased memory cells of the sector and re-performing the block erase operation on the sector until all words of the sector are erased or a second number of block erase operations is obtained comprises:
   initializing a word count and an erase pulse count to zero;
   selecting a word of the sector;
   determining whether the selected word of the sector is blank;
   determining whether the second number of block erase operations has been obtained if the word is not blank;
   performing a block erase operation on the sector if the second number of block erase operations has not been obtained, and incrementing the erase pulse count, otherwise failing the device if the second number of block erase pulses has been obtained;
   incrementing the word count if the word is blank;
   determining whether the final word of the sector has been obtained;
   repeating the sector erase verification operation if the final word of the sector has not been obtained; and
   passing the sector erase verification operation if the final word of the sector has been obtained.

36. The method of claim 32, wherein the second number of block erase operations comprises a maximum number of erase pulses allowed during an EOE phase of block erase operations.

37. The method of claim 36, wherein the second number of block erase operations is determined by a multi-bit code.

38. The method of claim 37, wherein the multi-bit code is input by a user.

39. The method of claim 37, wherein the bits of the multi-bit code correspond to a binary multiple of the first number of block erase operations.

40. The method of claim 38, wherein the multi-bit code comprises a 4 bit code.

\* \* \* \* \*